United States Patent [19]

Tsuda et al.

[11] Patent Number: 5,051,594

[45] Date of Patent: Sep. 24, 1991

[54] FINE POSITIONING DEVICE, AS FOR THE STAGE OF A SCANNING TUNNELING MICROSCOPE

[75] Inventors: Nobuhiro Tsuda; Hirofumi Yamada, both of Tsukuba; Fumihiko Ishida, Kawasaki; Masayuki Miyashita, Warabi, all of Japan

[73] Assignees: Japan Ministry of International Trade and Industry, Tokyo; Toshiba Corporation, Kanagawa; Nikon Corporation, Tokyo, all of Japan

[21] Appl. No.: 512,905

[22] Filed: Jun. 12, 1990

Related U.S. Application Data

[63] Continuation of Ser. No. 453,221, Dec. 21, 1989, abandoned, which is a continuation of Ser. No. 238,242, Aug. 30, 1988, abandoned.

[30] Foreign Application Priority Data

Feb. 29, 1988 [JP] Japan .................................. 63-44547

[51] Int. Cl.[5] .............................................. G21K 5/10
[52] U.S. Cl. ................................ 250/442.1; 250/440.1
[58] Field of Search ................ 250/306, 423 F, 442.1, 250/440.1

[56] References Cited

U.S. PATENT DOCUMENTS

| | | | |
|---|---|---|---|
| 3,835,338 | 9/1974 | Martin | 250/442.1 |
| 4,310,915 | 1/1982 | Gunter | 369/246 |
| 4,343,993 | 8/1982 | Binnig et al. | 250/306 |
| 4,384,230 | 5/1983 | Wismer | 310/317 |
| 4,623,947 | 11/1986 | Kasahara | 360/109 |
| 4,686,440 | 8/1987 | Hutamura et al. | 310/317 |
| 4,721,354 | 1/1988 | Kasper et al. | 350/96.21 |

OTHER PUBLICATIONS

Collection of Science Lecture Meeting Thesis, 1987 Autumn Conference of Japan Society of Precision Engineering, vol. 1, pp. 249-250, published Sep. 5, 1987.
Monthly Magazine "Sensor Technology" Dec., p. 4, Nov. 11, 1987.
News Paper, Agency of Industrial Science of Technology, vol. 35, No. 11, pp. 3-15, Nov. 1987.
Monthly Magazine "Machine Design" Dec., p. 4, Dec. 1, 1987.
Monthly Magazine "MOL" Feb., pp. 54-55, Feb. 1, 1988.

*Primary Examiner*—Bruce C. Anderson
*Attorney, Agent, or Firm*—Shapiro and Shapiro

[57] ABSTRACT

A fine positioning device such as a stage device for placing a probe or a sample thereon in a scanning tunneling microscope comprises a fixed member, a first structure spring stage having a first base member integral with the fixed member, a first moving member and a first resilient member for resiliently coupling the first base member and the first moving member such that they are displaceable relative to each other in a predetermined direction, a first actuator for displacing the first moving member relative to the base member in the predetermined direction, a second structure spring stage having a second base member integral with the first moving member, a second moving member and a second resilient member for resilient coupling the second base member and the second moving member such that they are displaceable relative to each other in a direction parallel to the predetermined direction, and a second actuator for displacing the second moving member relative to the second base member in the parallel direction.

23 Claims, 4 Drawing Sheets

FINE POSITIONING DEVICE, AS FOR THE STAGE OF A SCANNING TUNNELING MICROSCOPE

This is a continuation of application Ser. No, 453,221 filed Dec. 21, 1989, which is a continuation of application Ser. No. 238,242 filed Aug. 30, 1988, both of which are now abandoned.

BACKGROUND OF THE INVENTION

1. Field of the Invention

This invention relates to a fine positioning device and is more particularly concerned with such a device useful, for example, as a stage positioning device in a scanning tunneling microscope by which the shape of the surface of a substance, the very minute texture of the substance and the surface property of the substance may be observed in a non-contact fashion and with a high resolving power.

2. Related Background Art

A scanning tunneling microscope of this kind is known from U.S. Pat. No. 4,343,993. A probe used to detect a tunnel current by the scanning tunneling microscope is fixed to a base bed through an actuator constituted by piezo-electric elements which act in the directions of the x-axis, the y-axis and the z-axis, respectively. The piezo-electric elements acting in the directions of the x-axis and the y-axis are driven to displace the probe so as to scan a measurement sample, and the piezo-electric element acting in the direction of the z-axis is driven to control the distance between the sample and the probe.

In the above-described example of the prior art, the scanning range of the probe is limited to the stroke per se of the piezo electric elements As a method of solving this problem, it is conceivable to make the stroke of the piezo-electric elements great, but the resulting strains in the piezo-electric elements would introduce error in the position of the probe relative to the voltage applied to the piezo-electric elements.

SUMMARY OF THE INVENTION

The present invention has as its object the provision of stage positioning device for a scanning tunneling microscope and by which scanning of a sample by a probe can be accomplished over a great stroke.

To achieve the above object, the present invention uses a finely movable stage device constructed with a plurality of parallel spring structures for supporting the probe or the measurement sample to which displacement is imparted by an actuator, the spring structures being superposed one upon another.

The principle of the parallel spring structures is shown in FIGS. 1 and 2 of the accompanying drawings.

Referring to FIG. 1, a movable stage V and a base S are coupled together by two parallel leaf springs. The movable stage V shifts within a movement range of an amount of displacement d in response to an extraneous force in the direction of arrow being applied thereto. If three sets of such structures of FIG. 1 are superposed one upon another as shown in FIG. 2, the movement range of the movable stage V is increased to $3 \times d$.

DESCRIPTION OF THE PREFERRED EMBODIMENT

Figure 1:
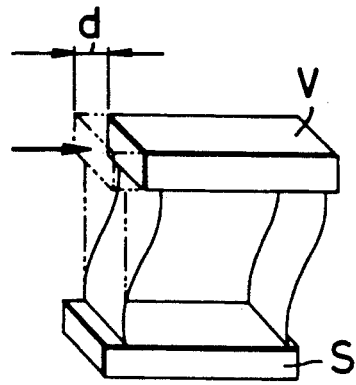
FIG. 1 is a perspective view illustrating the principle of a parallel spring structure.
Figure 2:
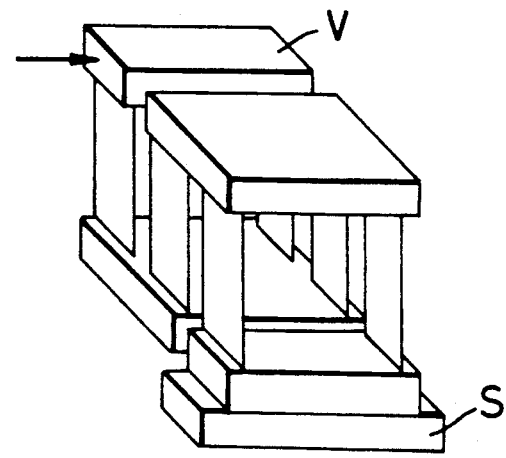
FIG. 2 is a perspective view illustrating the principle of parallel spring structures superposed one upon another.
Figure 3:
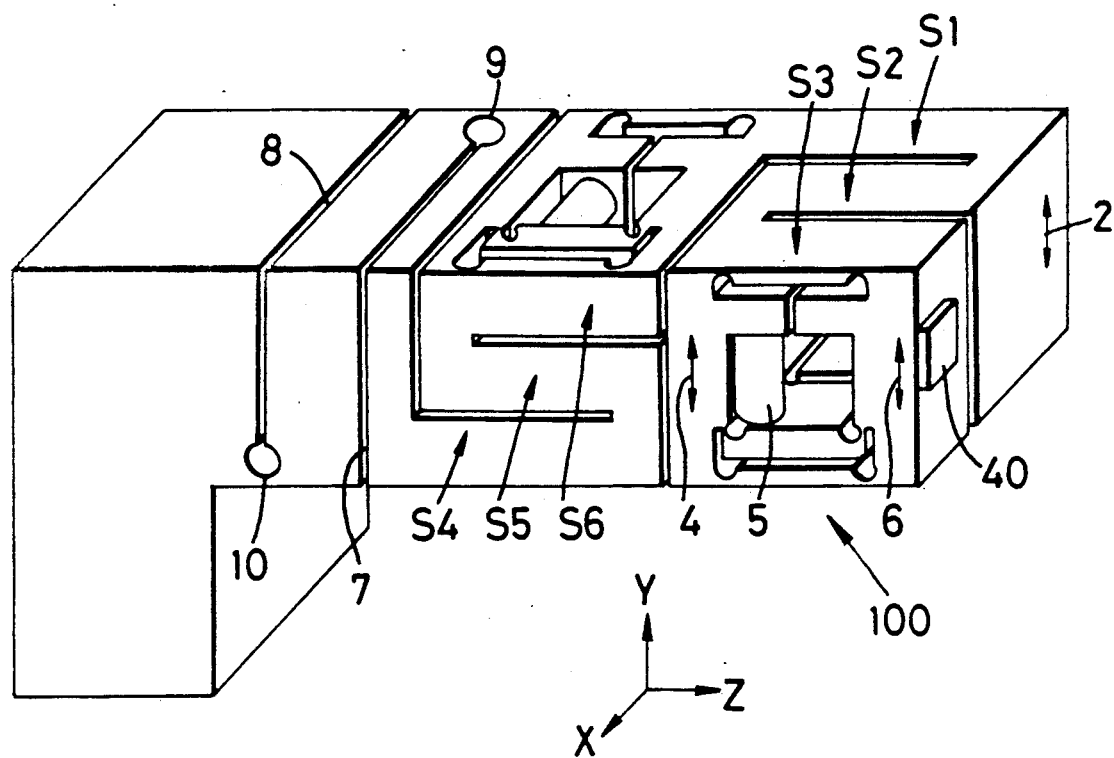
FIG. 3 is a perspective view of a stage constructed with superposed type parallel springs according to an embodiment of the present invention.
Figure 4:
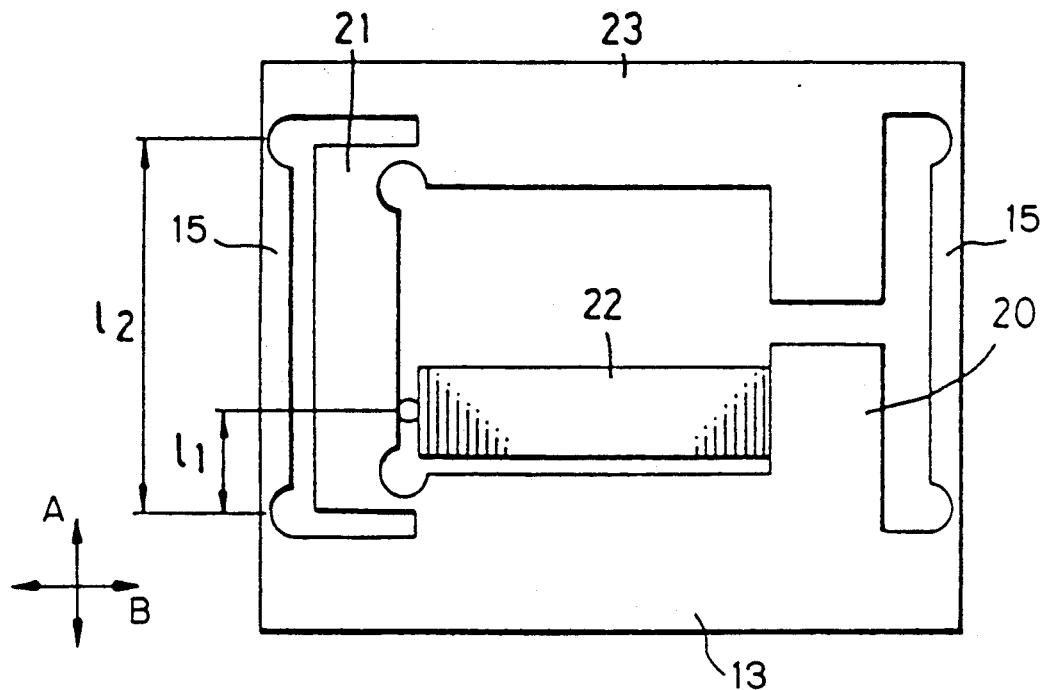
FIG. 4 is a plan view of a stage constructed with one stage of parallel springs.

FIG. 3 shows an embodiment of a stage device with superposed parallel spring structures constructed in accordance with the above-described principle, and FIG. 4 shows the construction of each parallel spring structure. In FIG. 4, a base member 13 and a moving member or stage 23 spaced along a first axis A are connected for resilient relative fine displacement along a second axis B perpendicular to the first axis by a pair of parallel leaf spring members 15 spaced apart along the second axis. An actuator 22 is inserted between a base column 20 of the base member 13, and a moving portion column 21 having opposite ends respectively connected to the base member and the moving member of the parallel spring structure. The actuator, when supplied with electrical energy, converts the electrical energy into kinetic energy, and may be, for example, a piezo-electrostrictive element, an electromagnet, a device utilizing the thermal expansion of a body by Joule heat, or the like.

The movable stage 23 of the parallel spring structure is movable by widening the spacing between the base column 20 and the moving portion column 21 by the actuator 22.

The amount of movement d of the stage 23 is determined to $d = (l_2/l_1)\delta$ by the amount of movement $\delta$ of the actuator 22, the distance $l_1$ from the fulcrum of the actuator and the size $l_2$ of the parallel spring. In an arrangement of superposed parallel spring structures, the amount of movement D of the final stage 23 in series is $D = (l_2/l_1)\delta n$, where n will be the number of stages of the parallel spring arrangement, and a stage positioning device incorporating such an arrangement can be realized without aggravating the resolving power if the leverage $l_2/l_1$ of each parallel spring is two to three times. For example, there can be realized an arrangement of this kind in which the resolving power (the controllable minimum amount of movement) amounts to 1 nm or less and the amount of movement of one stage amounts to 20-30 $\mu$m.

FIG. 3 is a perspective view showing an embodiment of a stage positioning device 100 constructed with parallel spring structures superposed one upon another two-dimensionally and with three spring structures for each dimension.

To form the device of FIG. 3, slits are alternately formed in a block material to provide three layers and thereby construct a series of parallel spring structures S1, S2 and S3. That is, the stage or moving member of the first spring structure in series S1 is constructed integrally with the base of the second spring structure in series S2, and the stage or moving member of the structure S2 is constructed integrally with the base of the third spring structure in series S3. As indicated by arrows 2, 4 and 6 in FIG. 3, the respective moving members of the structure S1, S2 and S3 move along the Y-axis by operation of the corresponding actuators (the actuator 5 of spring structure S3 being seen in the drawing).

A similar series of spring structures S4, S5 and S6 is oriented at 90° to the series S1–S3 to effect movement along the X-axis. Thus, the stage or movable member of the last structure S6 of series S4–S6 is connected to the base of the first structure S1 of the series S1–S3 to transmit the X-axis component of movement thereto.

An electrically conductive sample 40 to be measured is attached to the stage of the structure S3—that is, the X-Y stage of the device 100. The range of movement of the moving portion column of the structure S3 in direction Y as viewed from the base of the structure S1 is three times as great as the range of movement of the individual parallel spring structures. Thus, if the amount of movement of one parallel spring structure is 20–30 $\mu$m as previously described, a total amount of movement of 60–90 $\mu$m can be realized. Similarly, the spring structures S4–S6 provide an extended range of movement of the X-Y stage in the direction X. In the present embodiment, the number of parallel spring structures in each set is three, but the parallel spring structure can be superposed one upon another in any number to thereby secure a great stroke.

If the sample is inclined even slightly when a great stroke of scanning is effected, the drive range of the Z-axis will be exceeded. Thus, device 100 also included adjustable clearance cut-aways 7 and 8 so that, there can be accomplished angle adjustment by elastic deformation about hinges 9 and 10. As a result, the inclination of the stage of the parallel spring structure S3 can be changed to assure the required degree of orthogonality between the sample 40 and a probe (not shown) disposed in opposed relationship with the sample 40.

Figure 5:
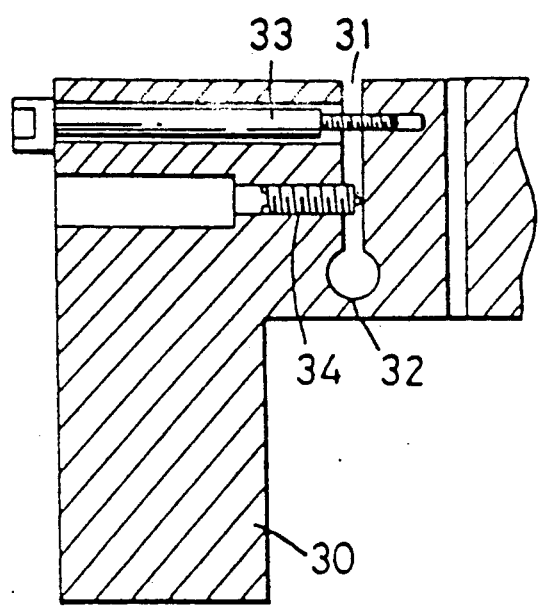
FIG. 5 is a cross-sectional view showing an angle adjusting mechanism.

An embodiment of the above-described angle adjusting mechanism will now be described with reference to FIG. 5.

A cut-away 31 is formed in a base bed 30, and by the push-pull adjustment of a screw 33 for pulling the stage portion at the right of the base bed 30 and a screw 34 for pushing the stage portion, elastic deformation is caused about a hinge 32 to thereby accomplish fine adjustment of the angle.

Figure 6:
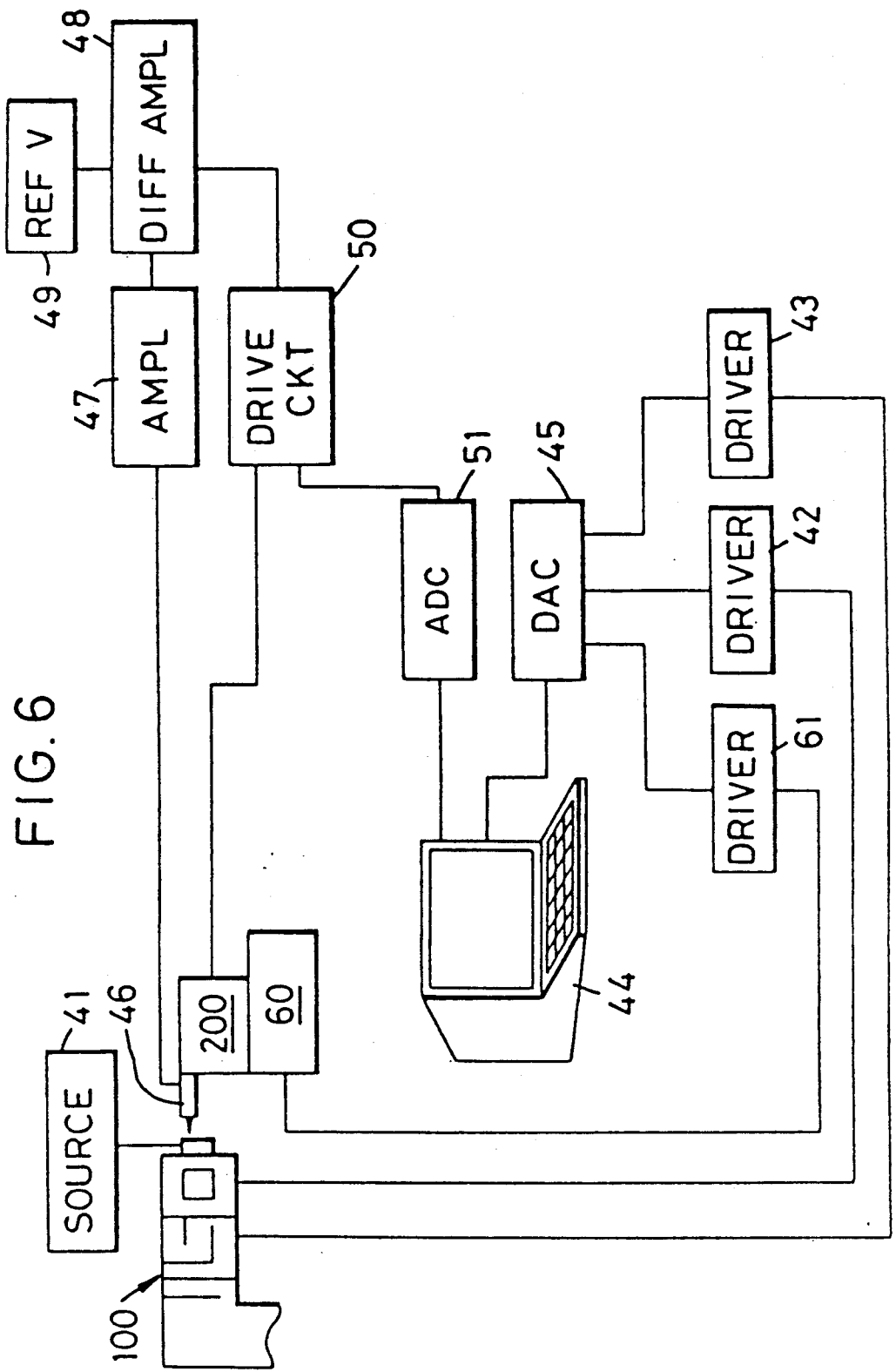
FIG. 6 is a block diagram of the control system of a scanning tunneling microscope according to an embodiment of the present invention.

FIG. 6 diagrammatically depicts the stage positioning device 100 and an associated control system in a scanning tunneling microscope. Basically, in operation of the microscope, a probe is brought close to the sample and a potential difference is applied between the two so that a tunnel current flows. The probe is controlled so that this current is kept constant, and the unevenness or the like of the sample can be measured from the required amount of control.

In the FIG. 6 arrangement sample 40 is placed on the X-Y stage of the device 100 constructed of the superposed parallel spring structures S1–S6, and a bias voltage source 41 for flowing a tunnel current to the sample 40 is connected to the X-Y stage. An electric power necessary to drive the stage is supplied to the actuators incorporated in the Y-axis parallel spring structure S1–S3 and the X-axis parallel spring structures S4–S6, through drivers 42 and 43. A control command for the scanning of the X-Y stage is executed by a computer 44.

The control command is output to the drivers 42 and 43 through a D/A converter 45.

Figure 7:
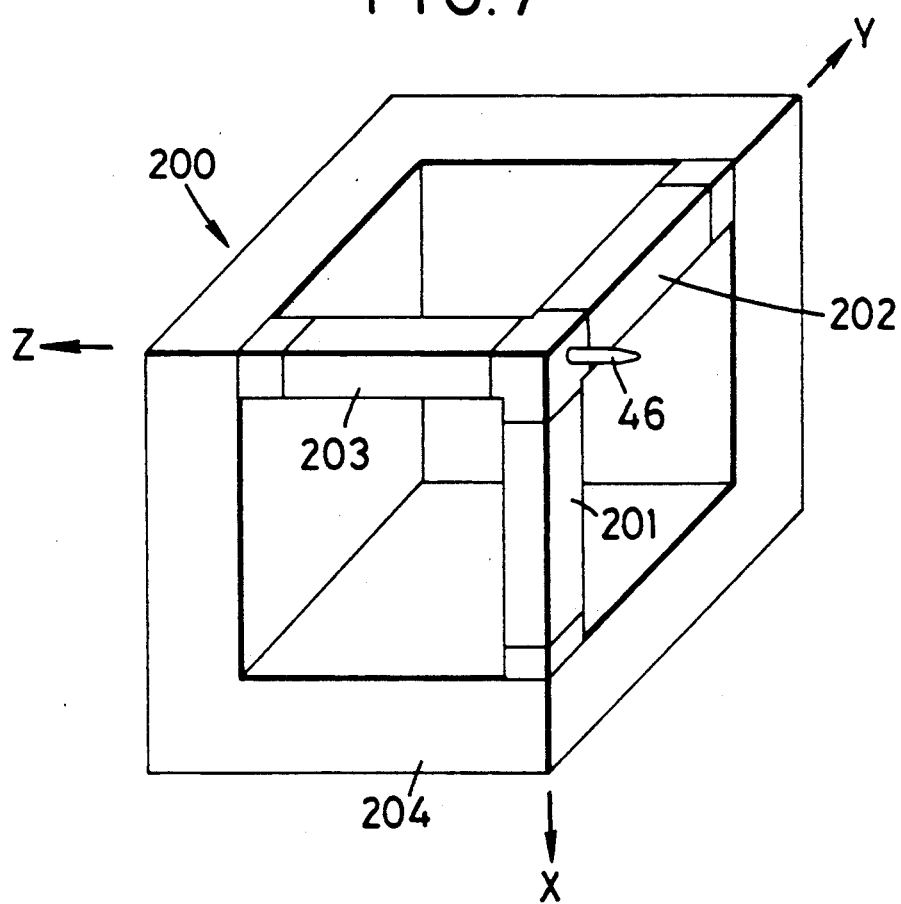
FIG. 7 is a perspective view of a device for finely moving a probe.

A probe 46 for detecting the tunnel current is mounted on a Z-axis fine moving device 200. This fine moving device is mounted on a Z-axis rough moving mechanism 60 driven by a driver 61, and is constructed as shown in FIG. 7. More particularly, the probe 46 is fixed to a base bed 204 through an actuator comprised of electrostrictive elements 201, 202 and 203 disposed in the directions of the X-axis, the Y-axis and the Z-axis, respectively. The electrostrictive elements 201 and 202 in the directions of the X-axis and the Y-axis are driven and displaced so that the probe scans the sample to be measured, and the electrostrictive element 103 in the direction of the Z-axis is driven to change the distance between the sample and the probe.

The operation of the present embodiment is as follows. First, rough setting is effected by the Z-axis rough moving mechanism 60 in response to the control command of the computer 44 so that the probe 46 can detect the tunnel current, and then the rough moving mechanism 60 is clamped. Subsequently, scanning of the X-Y stage is started and the Z-axis fine moving device 200 is controlled so that a constant tunnel current flows between the probe 46 and the sample 40.

The tunnel current detected by the probe 46 is amplified by an amplifier 47, and the difference between it and a reference voltage 49 corresponding to the set tunnel current is amplified by an error amplifier 48, and the electric power is amplified by a drive circuit 50 to drive the Z-axis fine moving device 200. Thereby control is effected so as to ensure a constant tunnel current to flow in the direction of the Z-axis. The driving signal of the Z-axis fine moving device 200 is converted into a digital signal by an A/D converter 51, and the digital signal is input to the computer 44 in synchronism with the scanning signal of the stage. That is, if the tunnel current is controlled to a constant level, the signal which drives the Z-axis fine moving device 200 coincides with the surface shape of the sample. Accordingly, the shape of the sample can be measured highly accurately.

We claim:
1. A fine positioning device comprising:
   a) a spring structure including
      a base member,
      a moving member spaced from said base member along a first of two perpendicular axes,
      a pair of parallel leaf spring members spaced apart along a second of said axes and connecting said base member and said moving member for resilient relative fine displacement along said second axis, and
      a movable column member positioned between said base member and said moving member and having one end connected to said base member and another end connected to said moving member; and
   b) an actuator provided between said base member and said movable column member, said actuator acting to move said movable column member to effect fine displacement of said moving member relative to said base member along said second axis through said movable column member.

2. A fine positioning device according to claim 1, further comprising control means for controlling said actuator.

3. A fine positioning device according to claim 2, wherein said actuator includes a piezo-electric element which deforms along said second axis in response to said control means.

4. A fine positioning device according to claim 3, wherein said control means includes circuit means for applying electric power to said piezo-electric element.

5. A fine positioning device according to claim 1, wherein said base member includes a column portion projecting along said first axis toward said moving member, and said actuator is provided between said movable column member and said column portion of said base member.

6. A fine positioning device according to claim 1, wherein said actuator acts on said movable column member in a direction of said second axis at a position intermediate said one end and said another end of said movable column member and closer to said one end.

7. A fine positioning device according to claim 1, wherein a plurality of said spring structures are superposed in series, with the moving member of each spring structure being fixed to the base member of the next spring structure in series, each spring structure being provided with a respective actuator as aforesaid.

8. A fine positioning device according to claim 7, wherein said control means includes means for controlling the respective actuators of said spring structures.

9. A fine positioning device according to claim 7, wherein said spring structures are formed in a common block of material.

10. A fine positioning device comprising:
a) a first spring arrangement having at least one first spring structure which includes
  a base member and a moving member spaced apart along a first of three mutually perpendicular axes and connected for resilient relative fine displacement along a second of said axes by a pair of parallel leaf spring members spaced apart along said second axis, and
  a movable column member positioned between said base member and said moving member and having opposite ends connected respectively to said base member and said moving member;
b) a second spring arrangement having at least one second spring structure which includes
  a base member and a moving member spaced apart along said first axis and connected for resilient relative fine displacement along a third of said axes by a pair of parallel leaf spring members spaced apart along said third axis, and
  a movable column member positioned between said base member and said moving member of said second spring structure and having opposite ends connected respectively to said base member and said moving member of said second spring structure; and
c) a respective actuator provided between the base member and the movable column member of each of said first and second spring structures, each actuator acting to move the movable column member of the corresponding spring structure to effect fine displacement of the moving member of that spring structure relative to the base member of that spring structure as aforesaid; and
d) wherein the moving member of a said second spring structure of said second spring arrangement is fixed to the base member of a said first spring structure of said first spring arrangement to impart movement along said third axis to said first spring arrangement.

11. A fine positioning device according to claim 10, further comprising control means for controlling said actuators.

12. A fine positioning device according to claim 11, wherein each actuator includes a piezo-electric element which deforms responsive to said control means in the direction of relative displacement of the corresponding base member and moving member.

13. A fine positioning device according to claim 10, wherein the base member of each of said first and second spring structures includes a column portion projecting toward the corresponding moving member, and the corresponding actuator is provided between said column portion and the corresponding movable column member.

14. A fine positioning device according to claim 10, wherein each actuator acts on the corresponding movable column member at a position intermediate said opposite ends of that movable column member and closer to the one of said opposite ends connected to the corresponding base member.

15. A fine positioning device according to claim 10, including a plurality of said first spring structures connected in series, with the moving member of each first spring structure being fixed to the base member of the next first spring structure in series, and a plurality of said second spring structures connected in series, with the moving member of each second spring structure being fixed to the base member of the next second spring structure in series.

16. A fine positioning device comprising:
a) a block of material having a first spring arrangement and a second spring arrangement formed therein,
  1) said first spring arrangement having at least one first spring structure which includes
    a base member and a moving member spaced apart along a first of three mutually perpendicular axes and connected for resilient relative fine displacement along a second of said axes by a pair of parallel leaf spring members spaced apart along said second axis, and
    a movable column member positioned between said base member and said moving member and having opposite ends connected respectively to said base member and said moving member,
  2) said second spring arrangement including at least one second spring structure which includes
    a base member and a moving member spaced apart along said first axis and connected for resilient relative fine displacement along a third of said axes by a pair of parallel leaf spring members spaced apart along said third axis, and
    a movable column member positioned between sad base member and said moving member of said second spring structure and having opposite ends connected respectively to said base member and said moving member of said second spring structure; and
b) a respective actuator provided between the base member and the movable column member of each of said first and second spring structures, each actuator acting to move the movable column member of the corresponding spring structure to effect fine displacement of the moving member of that spring structure relative to the base member of that spring structure as aforesaid; and c) wherein the moving member of a said second spring structure of said second spring arrangement is fixed to the base member of a said first spring structure of said first spring arrangement to impart movement along said third axis to said first spring arrangement.

17. A fine positioning device according to claim 16, wherein said block of material is formed with adjustable clearance slot means for adjusting inclination of said first and second spring arrangements relative to said first axis.

18. A fine positioning device according to claim 17, further including means for effecting clearance adjustment of said adjustable clearance slot means.

19. A fine positioning device according to claim 16, further comprising control means for controlling said actuators.

20. A fine positioning device according to claim 19, wherein each actuator includes a piezo-electric element which deforms responsive to said control means in the direction of relative displacement of the corresponding base member and moving member.

21. A fine positioning device according to claim 20 as a stage positioning device in a scanning tunneling microscope.

22. A fine positioning device according to claim 21, wherein each movable column member provides a leverage of about 2-3, such that the range of relative movement between the corresponding base member and moving member is about 2-3 times the range of movement of the corresponding piezo-electric element.

23. A fine positioning device according to claim 16, wherein the base member of each of said first and second spring structures includes a column portion projecting toward the corresponding moving member, and the corresponding actuator is provided between said column portion and the corresponding movable column member.

* * * * *